United States Patent [19]
Lorenz

[11] Patent Number: 5,485,122
[45] Date of Patent: Jan. 16, 1996

[54] DIFFERENTIAL AMPLIFIER CIRCUIT GIVING REDUCED DC OFFSET WITH UNBALANCED SOURCE RESISTANCES

[75] Inventor: Perry S. Lorenz, Sunnyvale, Calif.

[73] Assignee: National Semiconductor Corporation, Santa Clara, Calif.

[21] Appl. No.: 317,850

[22] Filed: Oct. 4, 1994

Related U.S. Application Data

[62] Division of Ser. No. 127,650, Sep. 28, 1993, Pat. No. 5,398,005.

[51] Int. Cl.$^6$ .................................................. H03F 3/45
[52] U.S. Cl. ............................................. 330/252; 330/261
[58] Field of Search ................................. 330/9, 252, 258, 330/261, 300

[56] References Cited

U.S. PATENT DOCUMENTS

| | | | |
|---|---|---|---|
| 5,220,288 | 6/1993 | Brooks | 330/261 X |
| 5,313,171 | 5/1994 | Burns et al. | 330/261 X |

*Primary Examiner*—Steven Mottola
*Attorney, Agent, or Firm*—Limbach & Limbach

[57] ABSTRACT

A Voss-type electronic tone control circuit in which the output of an amplifier is connected to the circuit output. An input resistor interconnects the circuit input and the amplifier inverting input and a feedback resistor interconnects the amplifier output and inverting input. One end of a first resistor is switched between the circuit input and the amplifier output. A first capacitor is connected between the other end of the first resistor and ground. A second capacitor is connected between the other end of the first resistor and one end of a potentiometer, the other end of which is grounded. The potentiometer slider feeds the amplifier non-inverting input. The capacitance of the second capacitor is different from that of the first capacitor, which enables the resistance of the first resistor to be increased, and the resistance of the potentiometer to be reduced compared with a conventional circuit. Increasing the first resistor resistance reduces loading on the boost/cut switch. Decreasing potentiometer resistance reduces the avenge source resistance presented to the amplifier non-inverting input, and, hence, the source resistance imbalance between the inverting and non-inverting inputs. The effects of the remaining source resistance imbalance are mitigated by unbalancing the input currents of the amplifier. The base of an auxiliary input transistor is connected to the amplifier inverting input. The emitter of the auxiliary transistor is connected to the second current generator to increase the current drawn by the inverting input.

16 Claims, 5 Drawing Sheets

DIFFERENTIAL AMPLIFIER CIRCUIT GIVING REDUCED DC OFFSET WITH UNBALANCED SOURCE RESISTANCES

This is a divisional of Application Ser. No. 08/127,650, filed Sep. 28, 1993, now U.S. Pat. No. 5,398,005 issued Mar. 14, 1995.

BACKGROUND OF THE INVENTION

Audio equipment using electronically-operated tone controls may use the so-called Voss tone control circuit shown schematically in FIGS. 1A through 1C.

In the Voss tone control circuit, a frequency cut characteristic is obtained by connecting the input signal to the non-inverting input 48 of the amplifier 10 via the frequency-selective network 12 and to the inverting input 50 via the input resistor 14, as shown in FIG. 1B. The amount of cut is selected by connecting the non-inverting input to a different point on the potentiometer 16 by selecting one of the plural electronically-controlled switches 18 through 25 (only the switches 18, 24, and 25 are shown in this example to simplify the drawing). The number of switches required depends on the desired fineness of the increments in the maximum mount of cut. Whether the circuit provides bass cut or a treble cut characteristic is determined by the frequency characteristics of the frequency-selective network 12, which, in the Voss circuit, is a band-pass filter.

A frequency boost characteristic is obtained by connecting the same frequency-selective network 12 between the output 52 and the non-inverting input 48 of the amplifier 10, as shown in FIG. 1A. The amount of boost is selected by connecting the non-inverting input to a different point on the potentiometer 16 by selecting one of the plural electronically-controlled switches 18 through 25.

Common electronically-controlled switches 18 through 25, and a common frequency-selective network 12 can be used to provide both boost and cut characteristics by adding the boost-cut changeover switch 32, as shown in FIG. 1C. This arrangement reduces circuit complexity, the external component count, and the number of package pins required.

The known Voss circuit uses the frequency selective network 12 shown in FIG. 1D, consisting of the resistor 40, the potentiometer 16, and two capacitors 44 and 46. In the Voss circuit, equal values (e.g., 68 nF in a bass control circuit) are used for the capacitors 44 and 46, and the values of the resistor 40 and the potentiometer 16 are selected to give the required characteristics. This results in the resistor 40 having a value of about 14k, which is less than one tenth of that of the potentiometer 16 (160k). Thus, the value of the resistor 40 is quite low, with the result that the resistor 40 imposes a considerable load on the boost-cut switch 32. This, in turn, requires that this switch must have a large area to provide an acceptably low level of distortion.

Also, in the known Voss circuit, the input current for the non-inverting input 48 of the amplifier 10 flows through the part of the potentiometer 16. Thus, the source resistance seen by the non-inverting input can be as high as about thirteen times that seen by the inverting input 50 (provided by the parallel combination of resistors 14 and 30, which are about 20k each). This causes a DC offset on the output of the amplifier 10.

Moreover, the source resistance seen by the non-inverting input varies, depending on which one of the electronic switches 18 through 25 is ON. When the switch 18 is ON (maximum boost or cut), the source resistance seen by the non-inverting input is as high as about 130k in the known circuit. When the switch 25 is ON, the source resistance seen by the non-inverting input is as low as the ON resistance of the electronic switch 25. The source resistance provided by the potentiometer 16 changing as the switches 18–25 are operated changes the DC level at the output of the amplifier 10, resulting in potentially audible switching clicks when the amount of boost or cut is changed.

Since the ratio between the values of the resistor 40 and the potentiometer 16 is set by the desired frequency selection characteristic of the frequency-selective network 12, increasing the value of the resistor 40 to reduce the load on the boost-cut switch 32 in the known circuit will increase the value of the potentiometer 16, which will worsen the offset and switching click problem. Alternatively, decreasing the value of the potentiometer 16 to reduce the offset and switching click problem in the known circuit requires that the value of the resistor 40 also be reduced, which results in increased distortion from the boost-cut switch.

Increasing the value of the input resistor 14 and the feedback resistor 30 would reduce the mount of source resistance imbalance, and, hence, the offset problem. However, increasing the value of each of these resistors to provide a DC source resistance in the range of average source resistance seen by the non-inverting input 48 could result in an unacceptably high output noise level.

OBJECTS AND SUMMARY OF THE INVENTION

It is an object of the invention to provide a Voss tone control circuit in which the loading on the boost/cut switch is reduced to enable the size of the switch to be reduced and/or for distortion to be reduced.

It is a further object of the invention to provide a Voss tone control circuit in which the source resistance presented to the non-inverting amplifier is reduced.

It is a yet further object of the invention to provide a Voss tone control circuit in which the variation of the source resistance presented to the non-inverting amplifier as the amount of boost or cut is changed is reduced.

It is a yet further object of the invention to provide a Voss tone control circuit in which the DC voltage offset at the output is reduced despite the unequal source resistances presented to the non-inverting input and the inverting input of the amplifier.

It is a yet further object of the invention to provide a Voss tone control circuit in which switching clicks as the amount of boost or cut is adjusted is reduced.

It is a final object of the invention to provided the above objects while retaining the basic advantages of the Voss tone control circuit, without increasing the noise level at the output of the tone control circuit, and without requiring special integrated circuit fabrication techniques.

Accordingly, a first aspect of the invention provides a Voss-type electronically-controlled tone control circuit that comprises an amplifier having an output connected to the circuit output. An input resistor is connected between the circuit input and the inverting input of the amplifier. A feedback resistor is connected between the amplifier output and the inverting input of the amplifier. The circuit finally comprises a frequency-selective network which includes a first resistor, one terminal of which is switched between the circuit input and the amplifier output. A first capacitor is connected between the other end of the first resistor and signal ground. A second capacitor is connected between the junction of the first resistor and the first capacitor and a potentiometer. The second capacitor has a capacitance different from the capacitance of the first capacitor. The other end of the potentiometer is connected to signal ground, and the slider of the potentiometer is connected to the non-inverting input of the amplifier.

Making the capacitors unequal in capacitance enables the resistance of the first resistor to be increased and the resistance of the potentiometer to be reduced compared with the conventional Voss circuit. Increasing the resistance of the first resistor reduces the loading on the boost/cut switch. Decreasing the resistance of the potentiometer reduces the average source resistance presented to the non-inverting input, and reduces the source resistance imbalance between the non-inverting input and the inverting input.

In a practical circuit, the potentiometer is realized using a series arrangement of resistors between the second capacitor and signal ground. Plural electronically-controlled switches connect the nodes between adjacent resistors to the non-inverting input of the amplifier. One switch is turned ON at a time to select the amount of boost or cut. Resistors are added between nodes towards the signal ground end of the series arrangement of resistors and their respective switches to reduce the variation in source resistance presented to the non-inverting input as the mount of boost or cut is varied.

With the arrangement just described, the source resistance presented to the non-inverting input and to the inverting input of the amplifier is considerably different. In the preferred embodiment, the average source resistance presented to the non-inverting input is about four times that presented to the inverting input. To reduce the DC offset on the output of the circuit, and hence to reduce switching clicks as the amount of boost or cut is changed, the invention also provides a differential amplifier providing a substantially zero output offset voltage when the non-inverting input is fed from a source resistance greater than the inverting input, or vice versa. The amplifier comprises first and second current generators. First and second input transistors are arranged in a balanced long-tail pair configuration fed by the fast current generator. The base of the first input transistor is connected to the non-inverting input, and the base of the second input transistor is connected to the inverting input. The amplifier also includes a circuit that derives the output voltage from the collector of one of the input transistors and feeds the output voltage to the amplifier output. The amplifier also includes a third transistor, the base of which is connected to either the non-inverting input or the inverting input, depending on which is fed from the lesser source resistance, i.e., the inverting input in the preferred embodiment operating in the Voss circuit. The emitter of the third transistor is connected to the second current generator.

The base current of the third transistor augments the total input current drawn from the lesser source resistance by the amplifier input to which it is connected, and hence increases the voltage drop across the lesser source resistance. The base current of the third transistor is chosen so that the voltage drop of the augmented input current across the lesser source resistance is the same as the voltage drop of the non-augmented input current across the greater source resistance.

In practice, when the first and second current generators consisting of transistors connected to a common reference voltage, the relative areas of the transistors can be chosen in accordance with the source resistance ratio between the two amplifier inputs.

DETAILED DESCRIPTION OF THE INVENTION

Figure 1A:
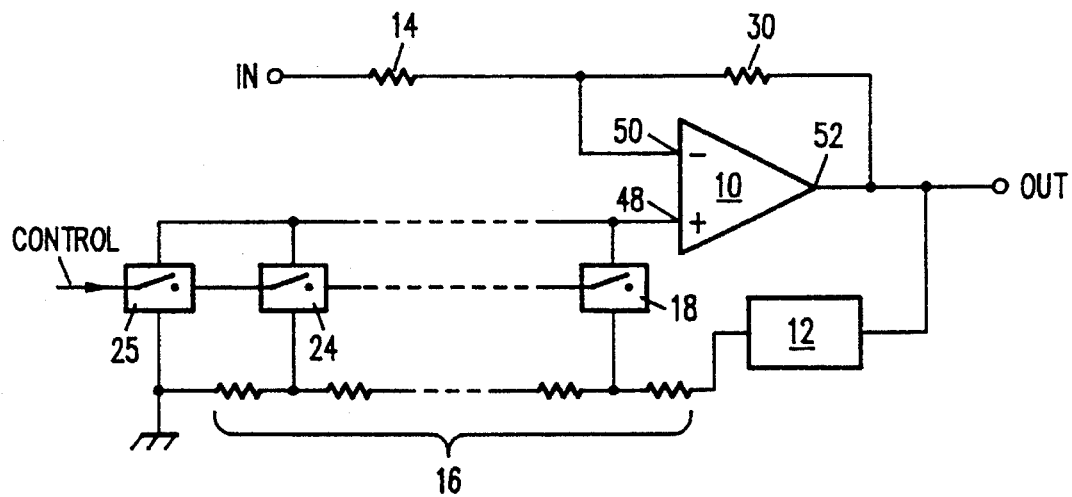
FIG. 1A is a block diagram showing the Voss tone control circuit in boost mode.
Figure 1B:
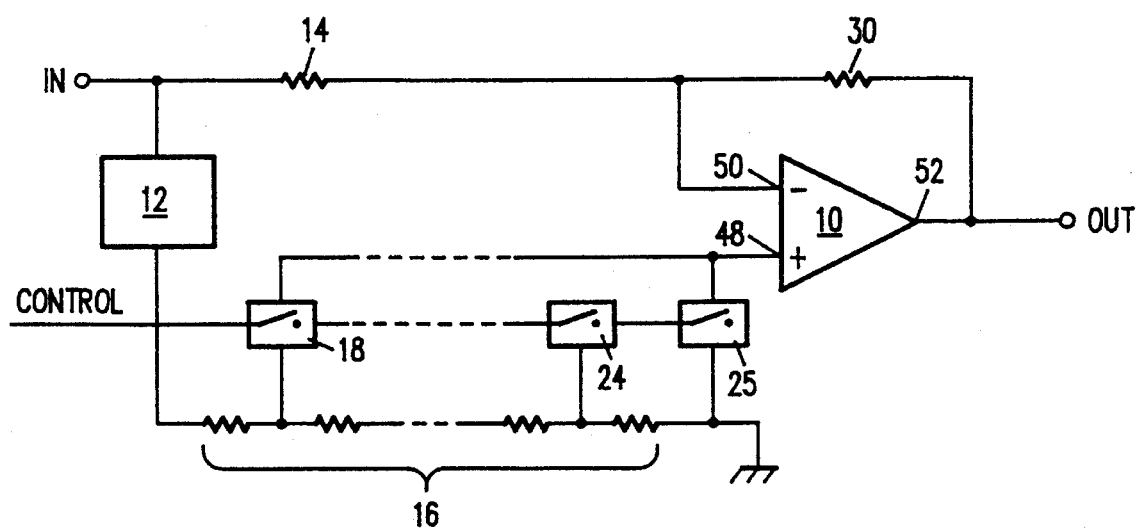
FIG. 1B is a block diagram showing the Voss tone control circuit in cut mode.
Figure 1C:
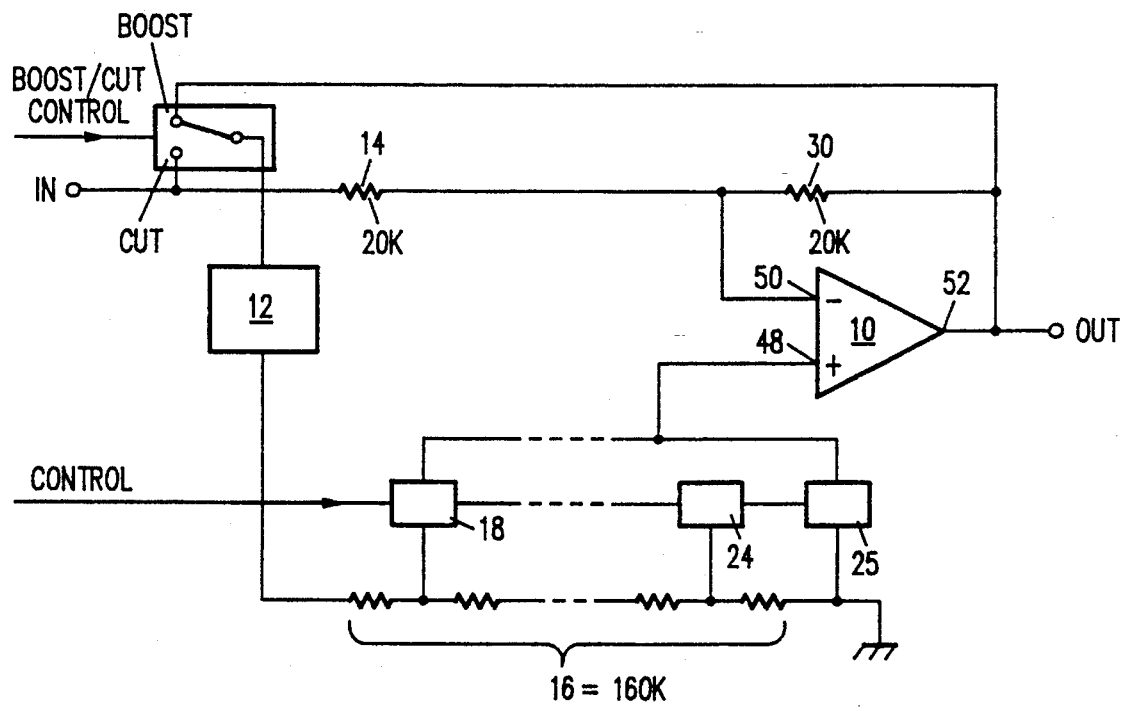
FIG. 1C is a block diagram showing a version of the Voss tone control circuit that is switchable between boost mode and cut mode.
Figure 1D:
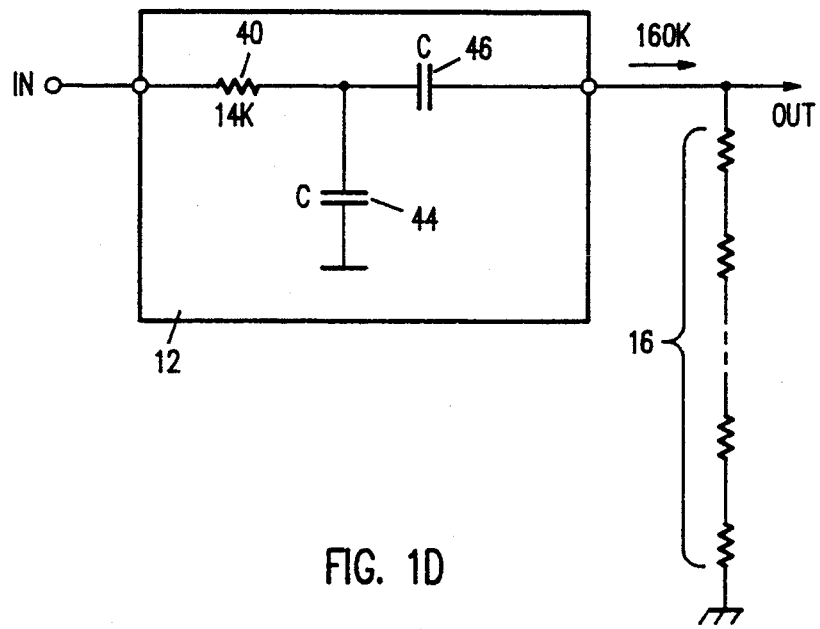
FIG. 1D shows details of the frequency-selective network.
Figure 2:
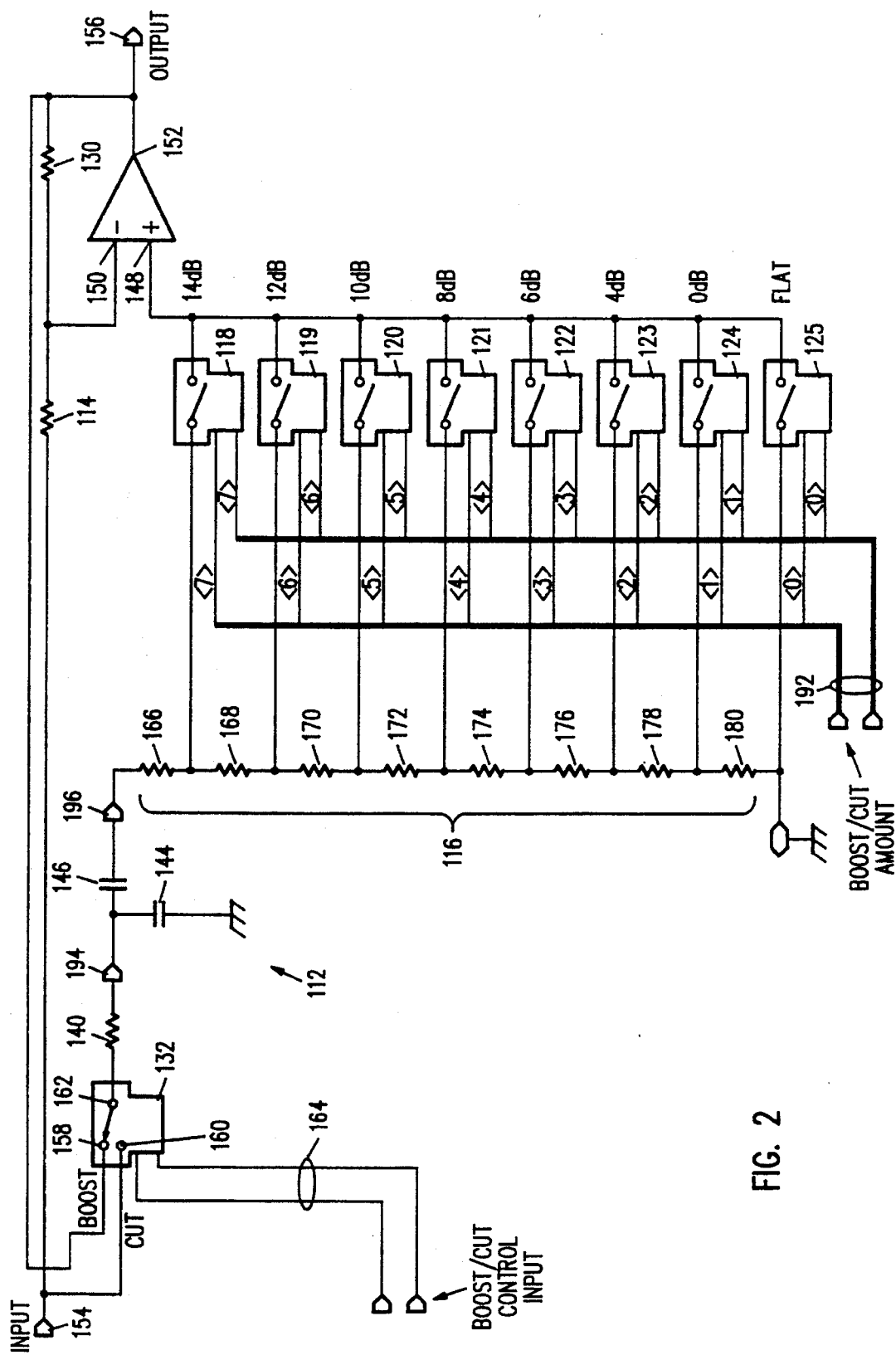
FIG. 2 shows the Voss tone control circuit according to a first aspect of the invention.

The circuit according to the first aspect of the invention is shown in FIG. 2. Components similar to those shown in FIGS. 1A through 1D are shown with the same reference number with 100 added. The circuit according to the first aspect of the invention has an identical topology to that of the known Voss circuit, but provides a reduced loading on the boost-cut switch 132, and a lower source resistance to the non-inverting input 48 of the amplifier 110. The circuit according to the first aspect of the invention achieves this by using unequal values for the capacitors 144 and 146. Making the value of the capacitor 146 about three times that of the capacitor 144 allows boost and cut characteristics similar to those of the original Voss circuit to be obtained while increasing the value of the resistor 140 by a factor of about 4.5, and decreasing the value of the potentiometer 116 by a factor of about 2.

The reduction in the value of the resistor 140 by a factor of about 4.5 allows the area of the boost-cut switch to be reduced by a similar factor for a given distortion value. The decrease in the value of the potentiometer 116 by a factor of 2 reduces the maximum DC offset at the output of the amplifier 110 by a similar factor.

Thus, in FIG. 2, the amplifier 110 has the non-inverting input 148, the inverting input 150, and the output 152. The feedback resistor 130 is connected between the output and the inverting input. The input resistor 114 is connected between the input terminal 154 and the inverting input.

The output 152 of the amplifier 110 is also connected to the output terminal 156, and to the "boost" terminal 158 of the boost/cut switch 132. The "cut" terminal 160 of the boost/cut switch is connected to the input terminal 154, and the common terminal 162 of the boost/cut switch is connected to one end of the resistor 140 in the frequency selective network 112. The boost/cut switch also receives the control inputs 164.

Connected to the end of the resistor 140 remote from the common terminal 162 of the boost/cut switch 132 are one end of the capacitors 144 and 146. The other end of the capacitor 144 is connected to signal ground, i.e., to ground or to a reference potential. The other end of the capacitor 146 is connected to one end of the potentiometer 116. The potentiometer consists of a serial arrangement of the resistors 166, 168, 170, 172, 174, 176, 178, and 180 connected between the end of the capacitor 146 remote from the resistor 140 and signal ground. Connected to the nodes between adjacent resistors in the potentiometer 116 are the first terminals of the single-pole electronic switches 118, 119, 120, 121, and 122, the second terminals of which are all connected to the non-inverting input 148 of the amplifier 110.

Also connected to the non-inverting input of the amplifier are the second terminals of the single-pole electronic switches 123, 124, and 125. The first terminals of the electronic switches 123 and 124 are connected to the nodes between the adjacent resistors 176 and 178, and 178 and 180, respectively, via the resistors 186 and 188, respectively. The first terminal of the electronic switch 125 is connected to signal ground via the resistor 190.

The electronic switches 118 through 125 receive control inputs 192 from the control circuit (not shown) such that only one of the electronic switches is turned ON at a time, the other electronic switches remaining OFF. The electronic switch turned ON determines the amount of boost or cut. The mount of boost or cut is a maximum when the electronic switch 118 is turned ON, is a minimum when the electronic switch 124 is turned ON, and is zero when the electronic switch 125 is turned ON.

The preferred embodiment shown provides up to 14 dB of boost or cut in 2 dB steps. Most of the circuit elements, which are provided by a bipolar integrated circuit, are the same in a treble control circuit and a bass control circuit. A treble control circuit is distinguished from a bass control circuit by different values of the capacitors 144 and 146, which are provided as external discrete components connected to the output pin 194 and the input pin 196 of the integrated circuit. Component values in the preferred embodiment are as follows:

| Resistors | | Capacitors | | |
|---|---|---|---|---|
| 114 | 20k | 144 | treble | 120pF |
| 130 | 20k | 144 | bass | 22nF |
| 140 | 62.7k | 146 | treble | 390pF |
| 166 | 14.2k | 146 | bass | 68nF |
| 168 | 4.0k | | | |
| 170 | 5.4k | | | |
| 172 | 6.7k | | | |
| 174 | 8.2k | | | |
| 176 | 10.9k | | | |
| 178 | 13.0k | | | |
| 180 | 16.8k | | | |

The frequency-selective network has a band-pass characteristic. The above components give time constants as follows:

| Treble: | Low-pass: | 55 µs | High-pass: | 4 µs |
|---|---|---|---|---|
| Bass: | Low-pass: | 9500 µs | High-pass: | 750 µs |

Figure 3:
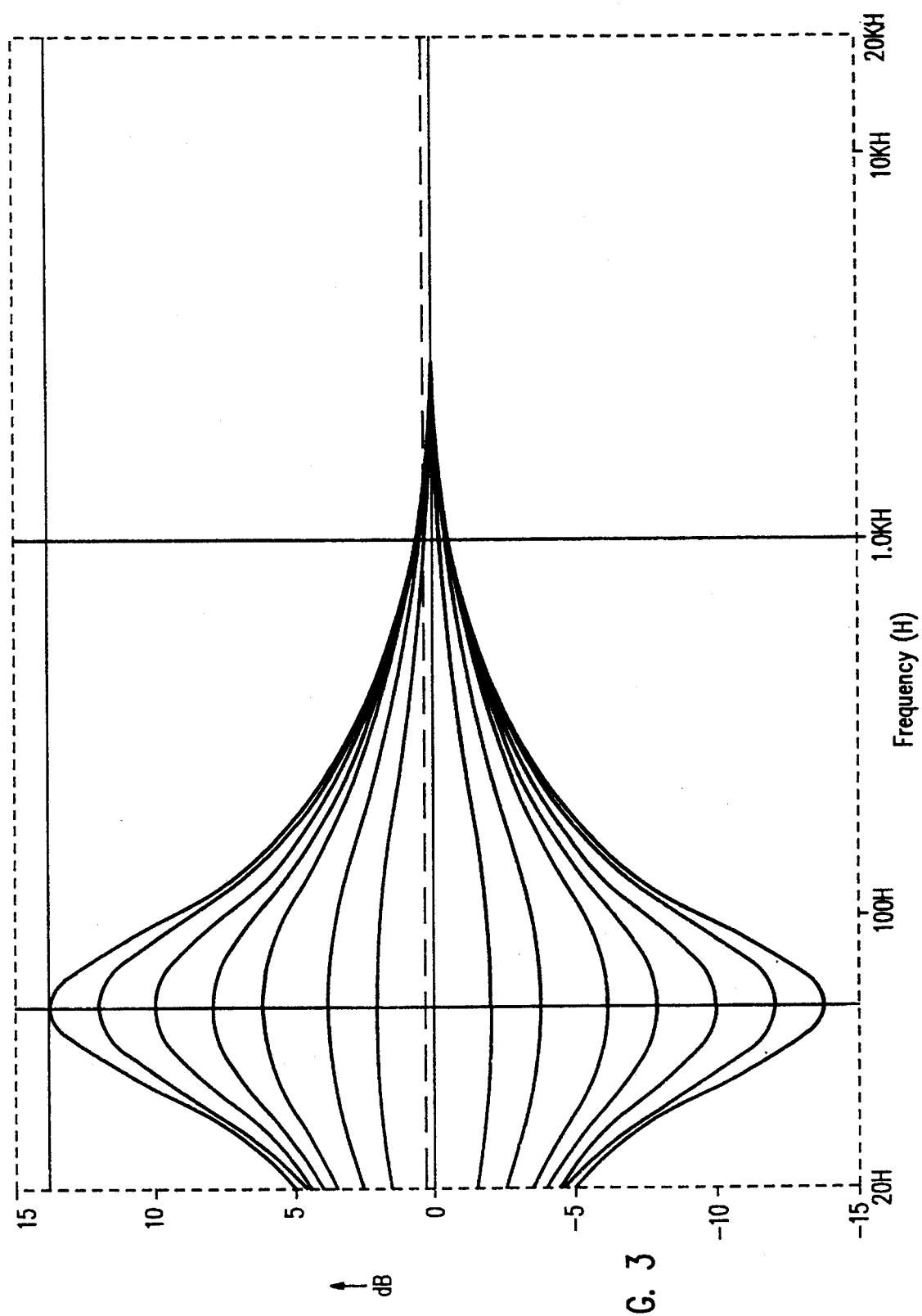
FIG. 3 shows the boost and cut characteristics of the Voss bass control circuit according to the first aspect of the invention.

FIG. 3 shows typical performance characteristics of a bass control circuit using the component values set forth above. In FIG. 3, the y-axis represents relative level in decibels, and the x-axis represents a logarithmic frequency scale.

The DC source resistance seen by the non-inverting input 148 of the amplifier 110, decreases progressively from a maximum of about 65k (the sum of resistors 168 through 180) to about zero as each of the switches 118 through 125, respectively, is mined ON. The resistors 186 through 190 are included in series with the switches 123 through 125, respectively, to increase the minimum of the range of the DC source resistance seen by the non-inverting input to about 25k. These resistors reduce the variation in the DC source resistance seen by the non-inverting input, However, the DC source resistance seen by the non-inverting input remains significantly higher than that presented to the inverting input 150 by the parallel combination of the input resistor 114 and the feedback resistor 130, each of which is about 20k in the preferred embodiment. With a conventional configuration in the amplifier 110, the inverting input and the non-inverting input have equal input currents, and this unequal source resistance leads to a DC offset at the output of the amplifier 110. Moreover, this DC level changes as the amount of boost or cut is changed, giving rise to potentially audible switching clicks.

Figure 4:
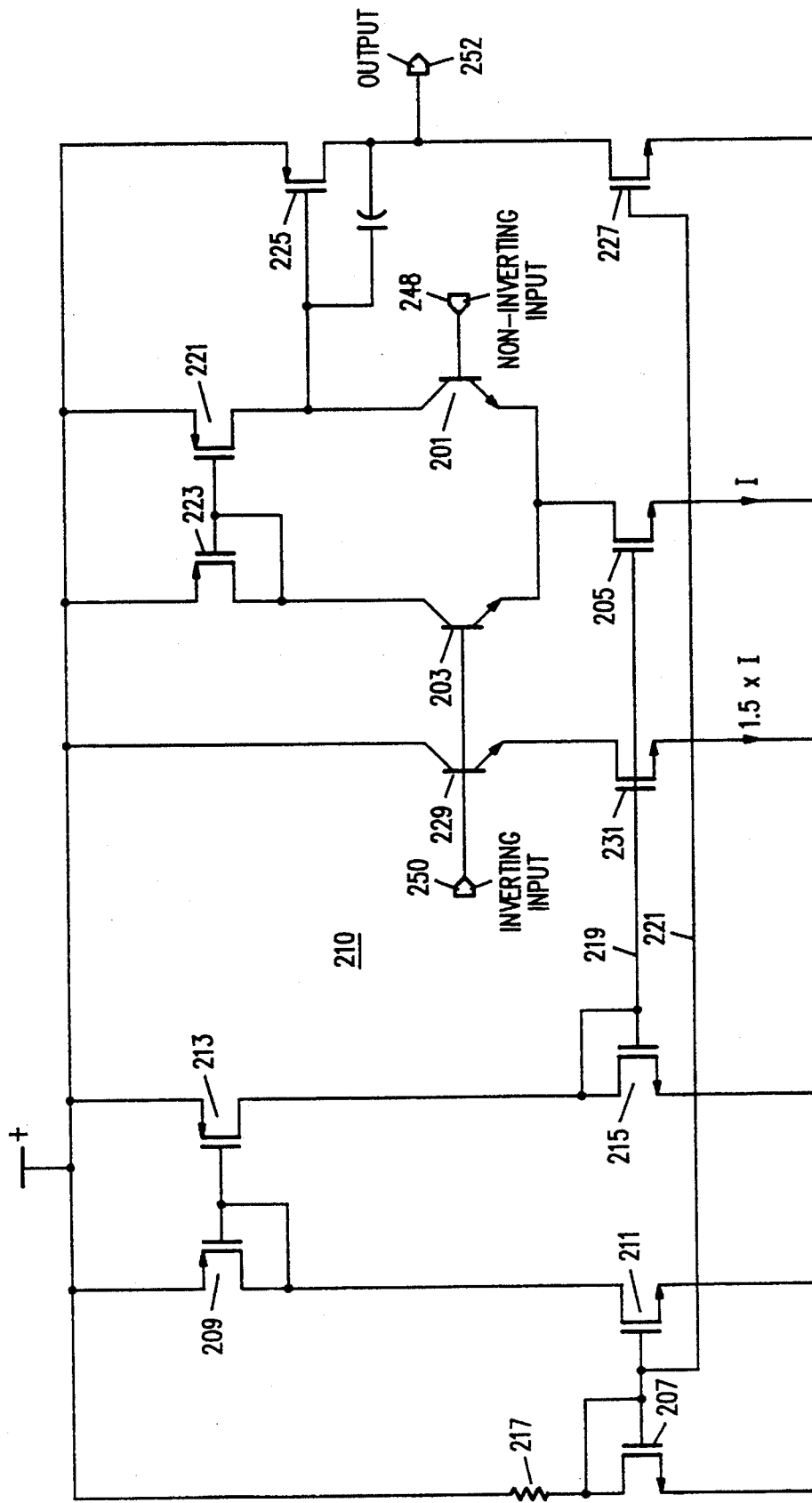
FIG. 4 is a circuit diagram of an amplifier according to the second aspect of the invention.

In the amplifier 210 according to a second aspect of the invention depicted in FIG. 4, the input current at the inverting input 250 is increased by a factor of about four compared with the input current at the non-inverting input 248 without a significant increase in the noise level at the output 252. With a source impedance imbalance of about four to one, this reduces the DC offset at the amplifier substantially to zero, and reduces the change in the DC offset when the amount of boost or cut is changed to reduce switching clicks to an inaudible level.

The amplifier 210 shown in FIG. 4 will be described in detail with the understanding that the invention can be applied to any amplifier having a balanced long-tail pair input stage with bipolar transistors similar to the arrangement shown in FIG. 4. The input stage of the amplifier 210 consists of the bipolar input transistors 201 and 203 in a balanced long-tail pair configuration, fed by the current generator formed by the transistor 205. The base of the transistor 201 is connected to the non-inverting input terminal 248. The base of the transistor 203 is connected to the inverting input terminal 250.

The transistors 207, 209, 211, 213, and 215, and the resistor 217 provide a reference voltage on each of the reference voltage lines 219 and 221. The base of the transistor 205 is connected to the reference voltage line 219.

The collectors of the input transistors 201 and 203 are connected to the current mirror formed by the transistors 221 and 223. The collector of the transistor 221 is connected to the base of the output transistor 225. The collector of the output transistor is connected to the output terminal 252, and to the collector of the load transistor 227, the base of which is connected to the reference line 221.

In the amplifier 210 according to the second aspect of the invention, the base of the additional transistor 229 is also connected to the inverting input terminal 250. The additional transistor may have the same geometry as the input transistors 201 and 203, and be located close to the input transistors 201 and 203 on the chip, so that the input transistors and the additional transistor are all matched. However, in practice, since the effect of a β mismatch is relatively small, the additional transistor 229 can be a minimum geometry device. Such a device occupies considerably less area on the chip than increasing the value (and, hence, the size) of the equalized input and feedback transistor 114 and 130, respectively (FIG. 2).

The collector of the additional transistor 229 is connected to the positive supply. The emitter of the additional transistor is connected to the output of the current generator formed by the transistor 231. The base of the transistor 231 is connected to the same reference line 219 as the base of the transistor 205 feeding the input transistors 201 and 203.

With this arrangement, the ratio of the input currents between the inverting input 250 and the non-inverting input 248 can be set by the ratio of the emitter current of the additional transistor 229 provided by the current generator 231 to the long-tail pair tail current provided by the current generator 205. This is achieved by making the area of the transistor 231 larger than that of the transistor 205 by a ratio depending on the input current ratio desired. In the preferred embodiment, the desired input current ratio is 4:1, which requires that the area ratio be 1.5:1. With this area ratio, the output of the current generator formed by the transistor 231 is 1.5 times that of the tail current of the long-tail pair. Hence, the emitter current of the additional transistor 229 is three times that of each of the input transistors 201 and 203.

With the emitter current ratio just described, the non-inverting input 248 has the input transistor 201 with an emitter current of x connected to it; and the inverting input 250 has the input transistor 203 with an emitter current of x, and the additional transistor 229 with an emitter current of 3x connected to it. Assuming roughly equal β's, the input current of the inverting input 250 is then about four times that of the non-inverting input 248.

With an input current ratio 4:1 as in the preferred embodiment, the DC offset at the output terminal 252 is reduced substantially to zero when the some resistance seen by the non-inverting input 248 is about four times that seen by the inverting input 250. In the tone control circuit shown in FIG. 2, the inverting input 150 sees a source resistance of about 10k, whereas the non-inverting input sees a source resistance that varies between about 65k and 25k. Thus, the source resistance seen by the non-inverting input increases or decreases by a factor of about 1.5 relative to the source resistance of about 40k at which zero offset is obtained.

A different input current ratio can be set simply by using a different ratio of the areas of the current generator transistors 205 and 231. In circuit configurations in which the inverting input sees a source resistance that is greater than that seen by the non-inverting input, the offset can be reduced by connecting the base of the additional transistor to the non-inverting input, instead of to the inverting input as in the example just described.

The approach according to the invention for reducing the offset at the output of the amplifier 210 when the non-inverting input 248 and the inverting input 250 see significantly different source resistances is preferable to simply increasing the lesser of the source resistances to balance the source resistances. The reduction in chip area provided by the approach according to the invention compared with increasing resistor values has already been mentioned. Further, since the emitter of the additional transistor 229 sees a relatively high source resistance, the additional transistor 229 contributes an insignificant amount of noise to the inverting input 250. Any noise contribution is significantly less than that which would result from increasing the values of the input resistor 114 and the feedback resistor 130 (FIG. 2). Finally, the additional transistor 229 has an insignificant effect on the stability and phase margin of the amplifier 210. Increasing the values of the input resistor and feedback resistor can introduce an undesirable secondary pole which could reduce the phase margin and stability.

Although this application describes illustrative embodiments of the invention in detail, it is to be understood that the invention is not limited to the precise embodiments described, and that various modifications may be practiced within the scope of the invention defined by the appended clam.

I claim:

1. A differential amplifier having a first input, a second input, and an output, the first input being one of an inverting input and a non-inverting input, the second input being the other of the inverting input and the non-inverting input, the amplifier providing a substantially zero output offset voltage when the first input is fed from a source resistance greater than the second input, the amplifier comprising:

a first current generator;

a second current generator;

a first input transistor and a second input transistor in a balanced long-tail pair configuration fed by the first current generator, each input transistor having a collector, the first input transistor having a base connected to the first input, the second input transistor having a base connected to the second input;

means for deriving an output voltage from the collector of one of the input transistors and for feeding the output voltage to the output; and a third transistor, including:

a base connected to the second input, and an emitter connected to the second current generator.

2. The differential amplifier of claim 1, wherein:

the first input is fed from a first source resistance, and the second is fed from a second source resistance, the first source resistance having a first ratio to the second source resistance; and the first current generator generates a first current and the second current generator generates a second current, the second current having a second ratio to the first current, the second ratio being determined by dividing the first ratio, less unity, by two.

3. The differential amplifier of claim 2, wherein:

the first current generator includes a fourth transistor having a base connected to a reference supply, the fourth transistor having an emitter area;

the second current generator includes a fifth transistor having a base connected to the reference supply, the fifth transistor having an emitter area greater than the emitter area of the fourth transistor by the second ratio.

4. The differential amplifier of claim 2, wherein:

the first ratio is four to one; and the second ratio is one and one half to one.

5. The differential amplifier of claim 1, wherein the first input transistor, the second input transistor, and the third transistor have matched characteristics.

6. The differential amplifier of claim 1, wherein:

the first input transistor and the second input transistor have matched characteristics; and the third transistor is a minimum-geometry transistor.

7. The differential amplifier of claim 1, wherein:

the first input is a non-inverting input and is connected to a greater source resistance than the second input, an inverting input; and the base of the third transistor is connected to the inverting input.

8. A differential amplifier having a first input, a second input, and an output, the first input being one of an inverting input and a non-inverting input, the second input being the other of the inverting input and the non-inverting input, the differential amplifier providing a substantially zero output offset voltage when the first input is fed from a source resistance greater than the second input, the amplifier comprising:

a balanced input stage comprising a first current generator feeding a first input transistor and a second input transistor connected as a long-tail pair, the first input transistor having a base connected to the first input and determining an input current of the first input, the second input transistor having a base connected to the second input and determining an input current of the second input;

means for deriving an output voltage from the balanced input stage and for feeding the output voltage to the output; and offset voltage compensating means for increasing the input current of the second input relative to the input current of the first input.

9. The differential amplifier of claim 8, wherein:

the first input is fed from a first source resistance, and the second input is fed from a second source resistance, less than the first source resistance, the first source resistance having a first ratio to the second source resistance; and the offset voltage compensating means increases the input current of the second input relative to the input current of the first input by a second ratio, the second ratio being equal to the first ratio.

10. The differential amplifier of claim 9, wherein:

the first ratio is four to one; and the second ratio is four to one.

11. A differential amplifier having a first input, a second input, and an output, the first input being one of an inverting input and a non-inverting input, second input being the other of the inverting input and the non-inverting input the differential amplifier providing a substantially zero output offset voltage when the first input is fed from a source resistance greater than the second input, the amplifier comprising:

a balanced input stage comprising a first current generator feeding a first input transistor and a second input transistor connected as a long-tail pair, the first input transistor having a base connected to the first input and determining an input current of the first input, the second input transistor having a base connected to the second input and determining an input current of the second input;

means for deriving an output voltage from the balanced input stage and for feeding the output voltage to the output; and offset voltage compensating means for increasing the input current of the second input relative to the input current of the first input, the offset voltage compensating means including:

a second current generator; and a third transistor having a base connected to the second input, and an emitter connected to the second current generator.

12. The differential amplifier of claim 11, wherein:

the first input is fed from a first source resistance, and the second input is fed from a second source resistance, the first source resistance having a first ratio to the second source resistance; and the first current generator generates a first current and the second current generator generates a second current, the second current having a third ratio to the first current, the third ratio being determined by dividing the first ratio, less unity, by two.

13. The differential amplifier of claim 12, wherein:

the first current generator includes a fourth transistor having a base connected to a reference supply, the fourth transistor having a first emitter area;

the second current generator includes a fifth transistor having a base connected to the reference supply, the fifth transistor having a second emitter area, the second emitter area being greater than the first emitter area by the third ratio.

14. The differential amplifier of claim 12, wherein:

the first ratio is four to one; and the third ratio is one and one half to one.

15. The differential amplifier of claim 11, wherein the first input transistor, the second input transistor, and the third transistor have matched characteristics.

16. The differential amplifier of claim 11, wherein:

the first input transistor and the second input transistor have matched characteristics; and the third transistor is a minimum-geometry transistor.

* * * * *

UNITED STATES PATENT AND TRADEMARK OFFICE
CERTIFICATE OF CORRECTION

PATENT NO. : 5,485,122
DATED : 01/16/96
INVENTOR(S) : Perry Scott Lorenz

It is certified that error appears in the above-indentified patent and that said Letters Patent is hereby corrected as shown below:

In Col. 9, line 26, please insert --the-- before "second".

In Col. 9, line 27, please insert --,-- after the second occurence of "input".

Signed and Sealed this

Sixteenth Day of April, 1996

Attest:

BRUCE LEHMAN

Attesting Officer      Commissioner of Patents and Trademarks